(12) United States Patent
Andry et al.

(10) Patent No.: US 6,403,407 B1
(45) Date of Patent: Jun. 11, 2002

(54) METHOD OF FORMING FULLY SELF-ALIGNED TFT WITH IMPROVED PROCESS WINDOW

(75) Inventors: Paul Stephen Andry, Mohegan Lake; Evan George Colgan, Chestnut Ridge, both of NY (US); Hisanori Kinoshita, Kusatsu; Hiroaki Kitahara, Ohtsu, both of (JP); Frank R. Libsch, White Plains; Kai R. Schleupen, Yorktown Heights, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/586,400

(22) Filed: Jun. 2, 2000

(51) Int. Cl.⁷ .......................... H01L 21/00; H01L 21/84
(52) U.S. Cl. ...................... 438/158; 438/151; 438/159; 438/160
(58) Field of Search ................ 438/151–155, 438/157–160, 311, 978

(56) References Cited

U.S. PATENT DOCUMENTS

| 4,076,559 A | * | 2/1978 | Chang et al. ............... 438/538 |
| 5,010,027 A | | 4/1991 | Possin et al. |
| 5,028,551 A | * | 7/1991 | Dohjo et al. .................. 438/30 |
| 5,156,986 A | | 10/1992 | Wei et al. |
| 5,340,758 A | | 8/1994 | Wei et al. |
| 5,391,507 A | * | 2/1995 | Kwasnick et al. ........... 438/158 |
| 6,140,164 A | * | 10/2000 | Zhang ......................... 438/163 |
| 6,156,590 A | * | 12/2000 | Yamazaki et al. .......... 438/166 |
| 6,229,156 B1 | * | 5/2001 | Murai et al .................... 257/57 |

OTHER PUBLICATIONS

Han et al., "A TFT Manufactured By 4 Masks Process with New Photolithography", Proceedings of the 18th International Display Research Conference, Asia Display, Sep. 28–Oct. 1, 1998, Seoul, Korea, pp. 1109–1111.
Mikuni Denshi, FDP Intelligence, 1999.5. Technical Report.

\* cited by examiner

Primary Examiner—Matthew Smith
Assistant Examiner—Craig P. Little
(74) Attorney, Agent, or Firm—F. Chau&Associates, LLP (57) ABSTRACT

A method for opening resist in raised areas of a semiconductor device. In one aspect, a conductive layer is formed over a channel insulator layer to form a raised portion including a height above a substantially planar surrounding area, the channel insulator layer being aligned to a gate electrode. A photoresist layer is formed over the raised portion and the surrounding area, and patterned by employing a gray scale light mask to reduce exposure light on the photoresist over the raised portion. Then, the photoresist is etched to thin it such that a gap is formed in the photoresist down to the conductive layer over the raised portion, but the photoresist remains everywhere else, and the conductive layer is etched in accordance with the photoresist to form source and drain electrodes which are self aligned to the channel insulator layer.

29 Claims, 6 Drawing Sheets

METHOD OF FORMING FULLY SELF-ALIGNED TFT WITH IMPROVED PROCESS WINDOW

BACKGROUND OF THE INVENTION

1. Field of the Invention

The present invention relates to thin-film field-effect transistors (TFTs), and more particularly to a method of fabricating devices which self align source/drain (S/D) contacts with a gate electrode where a channel insulator is also self-aligned (i.e., a fully self-aligned TFT), and utilizes simple process modifications to minimize the time and cost of producing such a self-aligned device.

2. Description of the Related Art

In a conventional staggered inverted bottom-gate thin-film transistor (TFT), such as those used in active matrix displays, the source and drain electrodes of all TFTs are aligned globally using corner alignment marks on a surface. Such a system has a limited accuracy, so there is a misalignment offset between the underlying gate electrode and the source and drain contacts (S/D contacts or electrodes). Because the S/D contacts are not self-aligned, the degree of overlap is usually increased at the mask level to allow for these offsets. This is undesirable because it increases the source-drain to gate (S/D-G) capacitance of the devices, which in turn increases the pixel feedthrough voltage ($\Delta Vp$) in the active matrix display.

The feedthrough voltage is caused by charge stored in the TFT source to gate (S-G) capacitance (Cgs) when the pixel TFT has charged the pixel and returns to its OFF state. The $\Delta Vp$ offset must be compensated for using a combination of passive elements (storage capacitors) included in the active matrix design and suitable electronic drive schemes. Any shift in S/D alignment across the active matrix may lead to incomplete compensation of $\Delta Vp$, and hence to visual artifacts in the finished display.

Because the source/drain contacts are not self-aligned, the amount of overlap on the channel insulator is increased in the mask design to insure adequate overlap even with a worst case alignment error. This is undesirable not only because it increases the feed through voltage but also because it places a lower limit on the channel length of the device. It is highly desirable to produce TFTs with shorter channel lengths due to the higher driving current which reduces the needed charging time for high resolution and high image content displays.

One method to self-align the source and drain contacts of a TFT to the gate electrode, which has been previously described in U.S. Pat. Nos. 5,156,986 and 5,340,758 as well as, a commonly assigned disclosure, entitled, "METHOD FOR FABRICATING SELF-ALIGNED THIN-FILM TRANSISTORS TO DEFINE A DRAIN AND SOURCE IN A SINGLE PHOTOLITHOGRAPHIC STEP", U.S. Ser. No. 09/410,280, filed on Sep. 30, 1999, and incorporated herein by reference, is to use a combination of the topography of the gate metal and/or top channel insulator with a planarizing or semi-planarizing layer over the source-drain metallization. By uniformly removing a portion of the planarization layer, a portion of the metallization is exposed that is in substantial alignment with the gate metal topography, and this exposed portion may then be etched to form self-aligned source and drain electrodes.

The process window of such methods is not as wide as one would desire to be considered conservative since, in general, the photoresist applied is not perfectly planar, the process used to thin the resist is not perfectly uniform, and the thickness of the resist over the channel topography depends somewhat on the aspect ratio of the features defined.

Another method for isolating the source and drain features which relies on the thinning of a photoresist in the channel region of a TFT has been described in "A TFT manufactured by 4 masks process with new photolithography" by C. W. Han et al., Asia Display '98 pp. 1109–1112 (1998). In this work, thinning of the resist in the channel was achieved by exposure through a gray scale mask, which limited the dose in the channel region such that only a portion of the resist there was removed at development, in contrast to regions which received either no exposure or the full dose, where, in the case of positive resist, these regions had a thickness greater than that of the channel region or no thickness remaining, respectively. In this case, however, the gray scale exposure is used to: a) fabricate the active a-Si island of a back-channel etch (BCE) type TFT and, through removal of only the thin channel photoresist in a subsequent step, to b) define the back-channel cut defining the source and drain contacts. In this way, the active island and channel cut are achieved in a single photolithographic step which simplifies the process. The TFT so produced, however, does not specifically make use of the topography of the gate electrode, and since the TFT is of the BCE type, there is no top channel insulator available to add extra topography. Thus the TFT described is not self-aligned and so does not enjoy the advantages of self-alignment described above.

Therefore, a need exists to produce fully self-aligned TFTs, e.g., with self-aligned S/D contacts and a channel insulator self-aligned to a gate electrode to reduce or eliminate the problems outlined above. In addition to reducing S/D-G capacitance and increasing pixel charging uniformity, it is also desirable to produce a TFT with a shorter channel since a shorter channel results in more current drive available for pixel charging and hence a shorter charging time which is important for high-resolution, high-performance active matrix displays.

SUMMARY OF THE INVENTION

In accordance with the present invention, methods are provided for improving thin film transistor fabrication processes. One improvement includes forming a fully self-aligned TFT using back exposure of a gate electrode to self-align the channel region to the gate electrode and then using the topography of the channel insulator, a photoresist layer which is partially planarized over the source and drain metallization, a modification of the usual photomask which is used to define the photoresist for etching the source and drain metallization, to include a gray level region overlapping the topography of the channel insulator, and a uniform resist etching step prior to etching the source and drain metallization. The density of the gray level mask region and the amount of resist etched are chosen so that the thickness of the resist which is exposed sufficiently to be removed by the developer along with that etched exceeds the thickness of the resist on the channel insulator and gate metal topography but is less then the thickness of the resist on areas without the channel insulator topography. Since the channel insulator is formed with a tapered edge, there is a transition region between these two thickness'of resist and the overlap distance of the source and drain contacts over the gate electrode is determined by the combination of the actual thickness of the resist removed and the distance between the edge of the channel insulator and the gate metal. Both of these distances can be adjusted by changing the processing conditions. The addition of the uniform etching step allows the process window defined by exposure and density of the mask gray scale regions to be effectively widened, since it removes the penalty of underexposure in the channel region. The process may then be chosen to be more conservative, since any resist left in the channel region after development will be considerably thinner than resist left elsewhere due to the combination of topography and gray scale exposure, and thus removable by uniform resist etching would take place in less time than would be case using topography alone.

A method for opening resist in raised areas of a semiconductor device, in accordance with the present invention, includes forming a conductive layer over a channel insulator layer to form a raised portion which includes a height above a substantially planar surrounding area, the channel insulator layer being aligned to a gate electrode, forming a photoresist layer over the raised portion and the surrounding area, and patterning the photoresist by employing a gray scale light mask to reduce exposure light on the photoresist over the raised portion such that a thickness of the photoresist is less over the raised portion than the thickness of the photoresist in the surrounding area, after the photoresist is developed. Then, the photoresist is etched to thin it such that a gap is formed in the photoresist down to the conductive layer over the raised portion, and the conductive layer is etched in accordance with the photoresist to form source and drain electrodes which are self aligned to the channel insulator layer.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to thin-film field-effect transistors (TFTs), and more particularly to a method of fabricating trilayer type TFT devices which self-aligns source/drain (S/D) contacts with a gate electrode, and utilizes simple process modifications to minimize the time and cost of producing such a fully self-aligned device. The present invention includes methods of forming fully self-aligned TFTs. Fully self-aligned refers to a self-aligned channel insulator relative to a gate electrode, as well as self-aligned source and drain contacts (S/D contacts) relative to the channel insulator (and therefore the gate electrode). These methods are based on using the topography of a gate electrode and a channel insulator in combination with a partial planarization by the source/drain photoresist coating.

This results in a thinner resist layer over the source/drain metallization on the channel insulator.

In one preferred embodiment, the photomask which is used to define the photoresist for etching the source and drain metallization is modified to include a gray level region which overlaps the topography of the channel insulator. The density of the gray level mask region is selected to remove the resist (after developing) overlaying those areas where the self-aligned insulator layer is present. In yet another embodiment, the resist is exposed with a gray scale mask or gray level mask so that the resist is thicker on other parts of the source drain metallization layer than on the channel insulator and the gate metal topography after developing. The resist is then removed from those areas where the self-aligned insulator is present, using a plasma etching step.

In preferred embodiments, a combination of the gray scale level mask and the plasma etching methods are employed. The two methods may have an increased process window compared to either process alone. With the resist etching process, difficulties may arise with the varied topography, device channel length, and layout between the array region and the various regions outside the array. These variations result in different thicknesses of resist remaining over the channel insulator in the different regions and for the different devices. This makes it difficult to find an optimum thickness of resist to etch which will provide good results in all regions at one time. With the gray level mask process, tight control of the photoresist thickness, exposure dose, and developing process may be needed to develop away the correct amount of resist. Removing too much resist may result in open devices and too little resist removal may result in a shorted device.

Figure 1A:
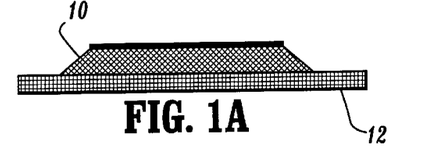
FIG. 1A is a cross-sectional view taken at section lines 1A—1A of FIG. 1B showing a partially fabricated thin film transistor having a substrate with a gate electrode formed thereon in accordance with the present invention.
Figure 1B:
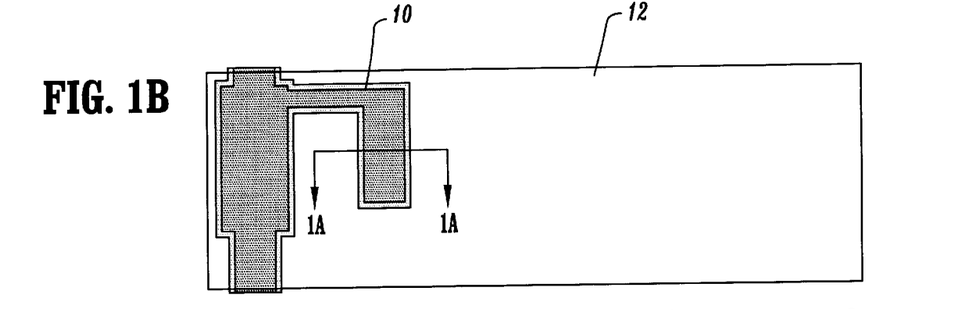
FIG. 1B is a top plan view of the partially fabricated thin film transistor of FIG. 1A showing the substrate with the gate electrode formed thereon in accordance with the present invention.

Referring now to the drawings in which like numerals represent the same or similar elements and initially to FIGS. 1A and 1B, a cross-sectional view of a partially fabricated transistor for a pixel cell is depicted after a first masking step in which a gate electrode 10 is defined on a substrate 12. Substrate 12 preferably includes a transparent material, such as, glass, quartz or plastic. Gate electrode 10 is formed by a metal or conductor deposition and patterned lithographically. Gate electrode 10 is preferably formed from an opaque material, and gate electrode 10 may be a single conductive layer of a metal such as chromium (Cr), tungsten (W), aluminum (Al), copper (Cu) and other electrically equivalent conductors, multilayer structure of metals in a capped or clad arrangement, such as, chromium above and/or below Al (Cr/Al), Molybdenum above and/or below Al (Mo/Al), and other similar conductors, and alloy structures, including, for example, several percent of Neodymium in Aluminum, etc. Gate electrode 10 preferably includes tapered edges to increase step coverage of overlying materials.

Figure 2:
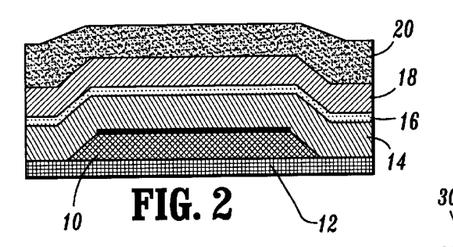
FIG. 2 is a cross-sectional view of the thin film transistor of FIG. 1A showing a first dielectric layer, a semiconductor layer, a second dielectric layer and a photoresist formed thereon in accordance with the present invention.

Referring to FIG. 2, a trilayer structure is formed which includes a dielectric layer 14, a semiconductor layer 16 and a dielectric layer 18. Dielectric layers 14 and 18 need not be the same material. Dielectric layers 14 and 18 may include, for example, silicon nitride, silicon oxide, silicon oxynitride, aluminum oxide, tantalum oxide, plasma deposited or reactively sputtered silicon oxide (SiOx), spin-on-glass, organic materials, such as, polyamide or BCB, or high-k dielectrics, such as, Barium Strontium Titanium oxide (BST), Barium Zirconium Titanium oxide (BZT), and tantalum pentoxide or combination thereof. Dielectric layers 14 and 18 may each include multi-layers, for example, $SiN_x$, $SiN_x/SiO_y$, $SiN_x/SiO_y/SiN_x$. These layers may be prepared by anodization and/or by plasma enhanced chemical vapor deposition (PECVD), electron cyclotron resonance CVD, laser-assisted CVD, or sputtering. Semiconductor layer 16 may include amorphous silicon (a-Si or a-Si:H), polysilicon or other layer of semiconductor material for forming a current channel for the transistor. A layer of photoresist 20 is formed on dielectric layer 18. Photoresist 20 may include photo-patternable polyimides, or self-assembled monolayers (also known as SAMs).

Figure 3:
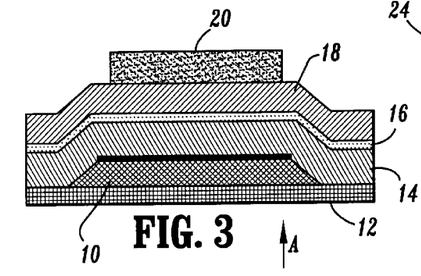
FIG. 3 is a cross-sectional view of the thin film transistor of FIG. 2 showing the photoresist patterned by a combination of back exposure using the gate electrode as a mask and a front side exposure using a mask in accordance with the present invention.

Referring to FIG. 3, photoresist 20 (e.g., positive resist, which remains where not exposed) is exposed using back-side exposure (in the direction of arrow "A") to ultraviolet light using gate electrode 10 as a mask. A second exposure of resist 20 is also performed with a mask (not shown) from the top side (opposite arrow "A") to remove resist from regions over gate electrode 10 where the insulation below the resist is not wanted. Subsequent development of photoresist 20 is performed to achieve the structure of FIG. 3. The distance of the photoresist from the edge of gate electrode 10 can be controlled by the backside exposure time of the resist to UV light. The remaining photoresist is advantageously centered over gate electrode 10.

Figure 4A:
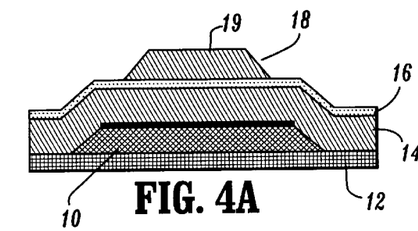
FIG. 4A is a cross-sectional view of the thin film transistor of FIG. 3 taken at section lines 4A—4A of FIG. 4B showing the second dielectric layer etched to form a self-aligned top insulation portion (Istop) in accordance with the present invention.
Figure 4B:
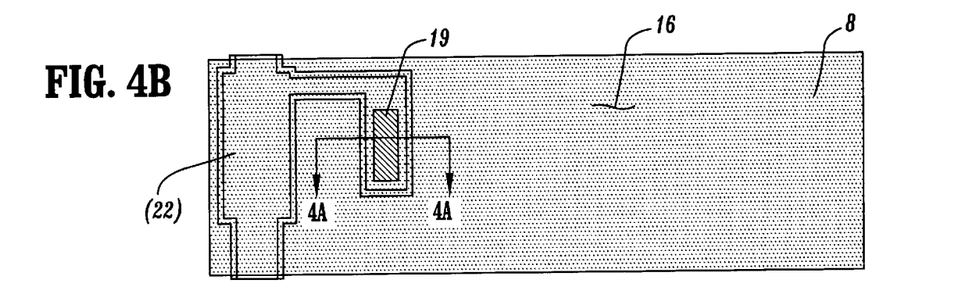
FIG. 4B is a top plan view of a pixel (with gate lines visible for clarity) showing the second dielectric layer etched to form a self-aligned top insulation portion (Istop) in accordance with the present invention.

Referring to FIGS. 4A and 4B, etching of dielectric layer 18 is performed to leave a portion 19 of dielectric layer 18 centered over gate electrode 10. Portion 19 may be referred to as a channel insulator, an Istop or a top insulator. Portion 19 preferably includes tapered edges. FIG. 4B shows a top view of a pixel cell 8 after portion 19 has been etched. Gate lines 22 are shown while semiconductor layer 16 and dielectric layer 14 are invisible for clarity. Note that due to the back exposure, the channel insulator 19 is self-aligned to gate electrode 10.

Figure 5:
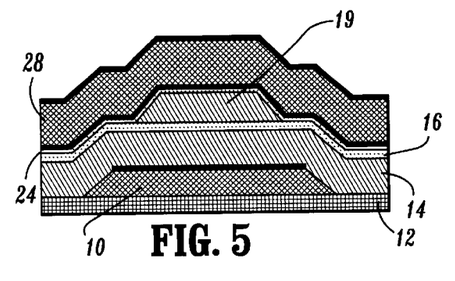
FIG. 5 is a cross-sectional view of the thin film transistor of FIG.. 4A showing a doped semiconductor layer and a conductor layer deposited in accordance with the present invention.

Referring to FIG. 5, a doped semiconductor layer 24 is deposited. Semiconductor layer 24 may include heavily doped amorphous silicon, microcrystalline or polycrystalline silicon. Layer 24 is preferably n+doped; however, p-doping may also be performed. Layer 24 may be plasma deposited by employing a plasma enhanced chemical vapor deposition (PECVD) process. Layer 24 contacts layer 16 beyond the edges of portion 19. A conductive layer 28 is deposited on doped semiconductor layer 24. Conductor layer 28 may include Indium Tin Oxide (ITO) or Indium Zinc Oxide (IZO), aluminum, aluminum alloys, clad aluminum, molybdenum, chromium, moly-tungsten, and/or copper. Conductor 28 may be sputtered on doped layer 24. Conductor 28 may include multiple conductive layers, for example a Mo/Al/Mo sandwich structure (e.g., Mo clad Al) or equivalent conductive materials.

Figure 6A:
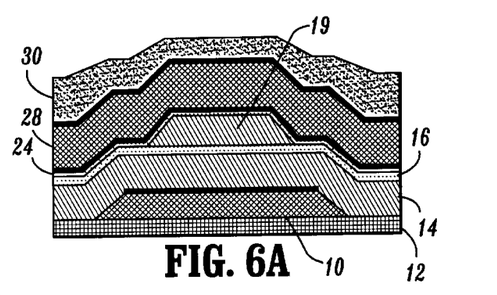
FIG. 6A is a cross-sectional view of the thin film transistor of FIG. 5 taken at section lines 6A—6A of FIG. 6B showing a second photoresist deposited in accordance with the present invention.

Referring to FIG. 6A, a layer of photoresist 30 is deposited which may include, for example, photo-patternable polyimides, or self-assembled monolayers. Photoresist 30 may be spun onto the surface of conductive layer. Resist 30 is thinner over Istop layer 19 since this structure is raised above the surrounding area.

Figure 6B:
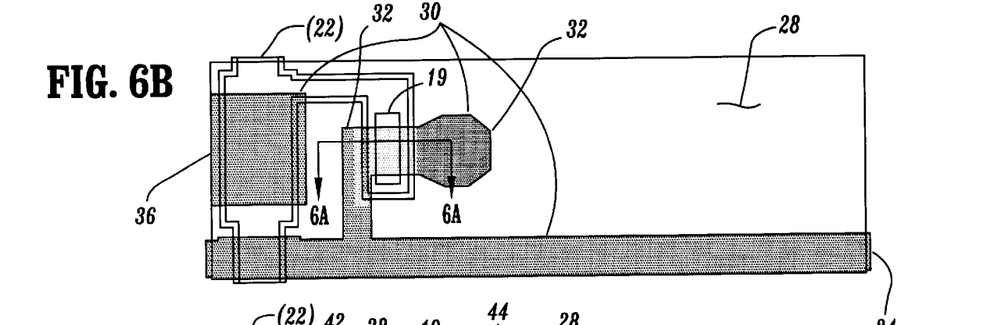
FIG. 6B is a top plan view of the pixel (with gate lines visible for clarity) of FIG. 6A showing the second photoresist deposited and patterned with a gray scale mask overlapping the self-aligned top insulator portion wherein the location of the gray scale mask is shown, not the resulting photoresist pattern.
Figure 7:
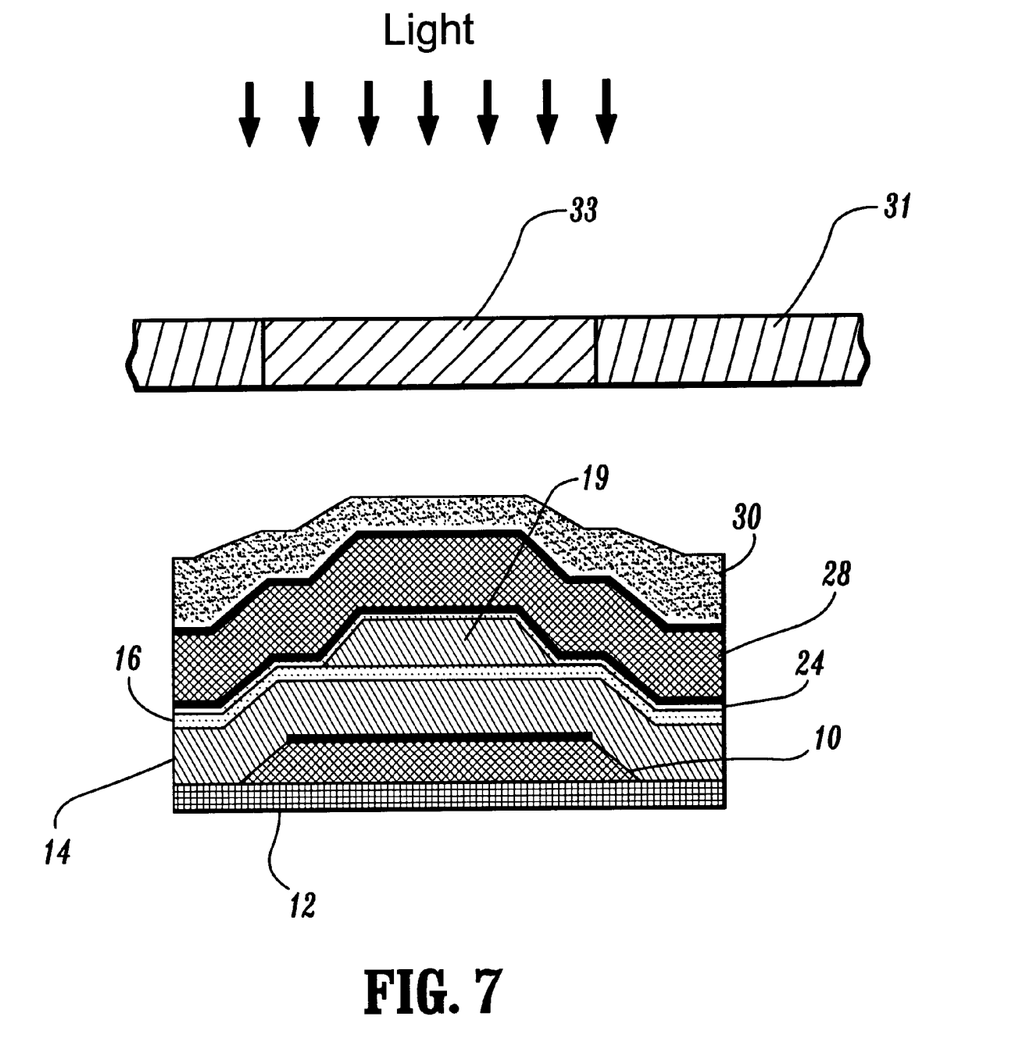
FIG. 7 is a cross-sectional view of the thin film transistor of FIG. 6A showing the second photoresist exposed using a gray scale mask in accordance with the present invention.

Referring to FIG. 7, photoresist 30 is patterned by UV exposure through a top mask 31 followed by development to leave resist images or patterns for a source/drain 32 (without a gap therebetween), signal lines 34 (or data lines), capacitor electrode patterns 36 and all other devices which may be part of an active matrix display as shown in FIG. 6B. In accordance with the present invention, mask 31 includes a gray scale or gray level mask portion 33 which overlaps the Istop layer or top insulator 19. Advantageously, fine alignment is not needed between mask portion 33 and Istop layer 19 due to the reduced thickness of the photoresist on Istop layer 19. In one example, the gray level mask portion 33 extends beyond Istop layer 19 by about 2 microns on each side.

Figure 8:
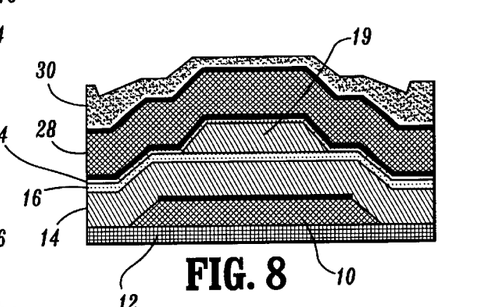
FIG. 8 is a cross-sectional view of the thin film transistor of FIG. 7 showing the second photoresist thinned after development of the second photoresist exposed using a gray scale mask in accordance with the present invention.

Gray scale portions 33 are employed to reduce light exposure of resist 30 at selected locations, e.g., over gate conductor 10. In this way, resist 30 is exposed enough to remove a portion of its thickness over gate conductor 10, but not exposed enough to completely remove resist 30 from layer 28 over gate conductor 10 after being developed, as shown in FIG. 8.

Figure 9:
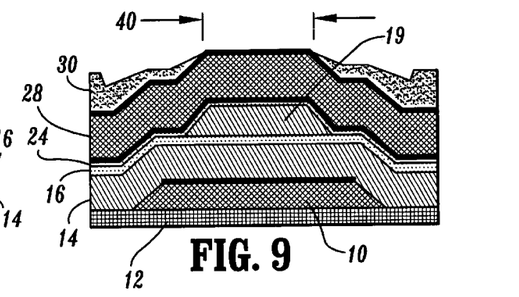
FIG. 9 is a cross-sectional view of the thin film transistor of FIG. 8 showing the second photoresist thinned by a uniform etch to expose the conductor over the self-aligned top insulator in accordance with the present invention.

Referring to FIG. 9, the patterned resist images are etched such that the resist on layer 28, overlying portion 19, is completely removed before the resist elsewhere has been removed. This uniform etch or plasma ashing thins all patterned portions, e.g., source/drain pattern 32, data line patterns 34, capacitor electrode patterns 36, etc. (see FIG. 6B). Since photoresist 30 on layer 28 over portion 19 (Istop) is thinner due in part to the gray scale exposure, a breakthrough is achieved in a shorter time in this region, thereby forming a gap 40 in photoresist 30. The breakthrough is advantageously provided at the desired location (i.e., on conductive layer 28 over Istop layer 19).

Note that, it is acceptable to even remove some resist from conductive layer 28 over the tapered sides of channel insulator 19. Conductive layer 28 and semiconductor layer 24 cannot form an electrical connection over channel insulator 19, and semiconductor layer 24 extends some small distance up the tapered edges of channel insulator 19 (as shown in FIG. 10A).

In a preferred embodiment, pure oxygen is employed for the non-selective etch as there is minimal attack or damage to other metal, semiconducting and insulating materials. Other embodiments may include oxygen mixed in proportion with an inert gas such as Ar or He, or the use of another oxygen-containing gas such as nitrous oxide ($N_2O$). Advantageously, by employing a gray scale mask, resist 30 on layer 28 is thinned over gate conductor 10 such that the process window is significantly increased for forming self-aligned source/drain contacts.

Figure 10A:
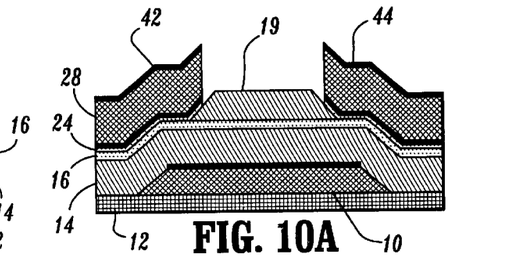
FIG. 10A is a cross-sectional view of the thin film transistor, taken at section lines 10A—10A of FIG. 10B, showing the second photoresist removed after being employed to etch the conductor and the doped semiconductor layers in accordance with the present invention.
Figure 10B:
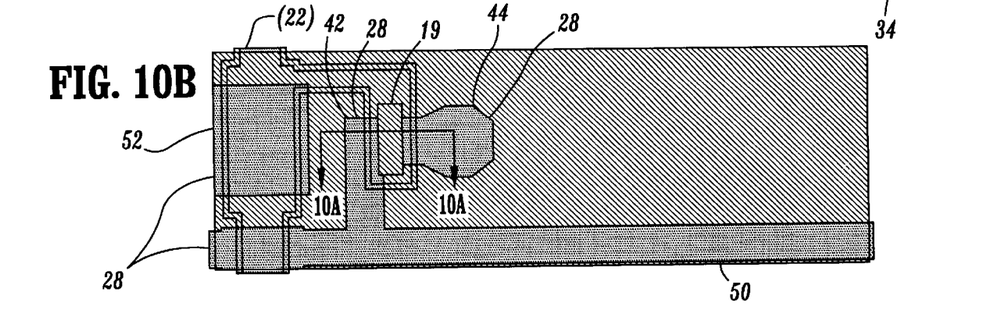
FIG. 10B is a top plan view of the pixel (with gate lines visible for clarity) of FIG. 9 showing the second photoresist removed after being employed to etch the conductor and the doped semiconductor layers in a pattern in accordance with the present invention.

Referring to FIGS. 10A and 10B, conductor layer 28 and doped semiconductor layer 24 are etched in accordance with the resist pattern such that a drain electrode 42 and a source electrode 44 are formed and are aligned to gate electrode 10 (since portion 19 is also self-aligned to electrode 10) thereby forming a fully-self-aligned TFT. Signal lines (data lines) 50, capacitor electrodes 52 and all other devices may be simultaneously formed. In preferred embodiments, the etching of layer 28 is performed by a wet etching process. In one embodiment, the etching uses a mixture of phosphoric, acetic and nitric acids known as a PAN etch for aluminum, Al alloys and molybdenum metals. The etching of layers 24 and 16 is preferably performed by dry etching. Then, resist 30 is removed. Processing now continues as is known in the art.

Another method for self-aligning S/D contacts to a channel insulator (Istop) will now be described. In this embodiment, a gray level mask is employed to remove the resist from a conductor over the Istop layer. The method includes the steps as set forth and described with reference to FIGS. 1A through 6A.

Figure 11:
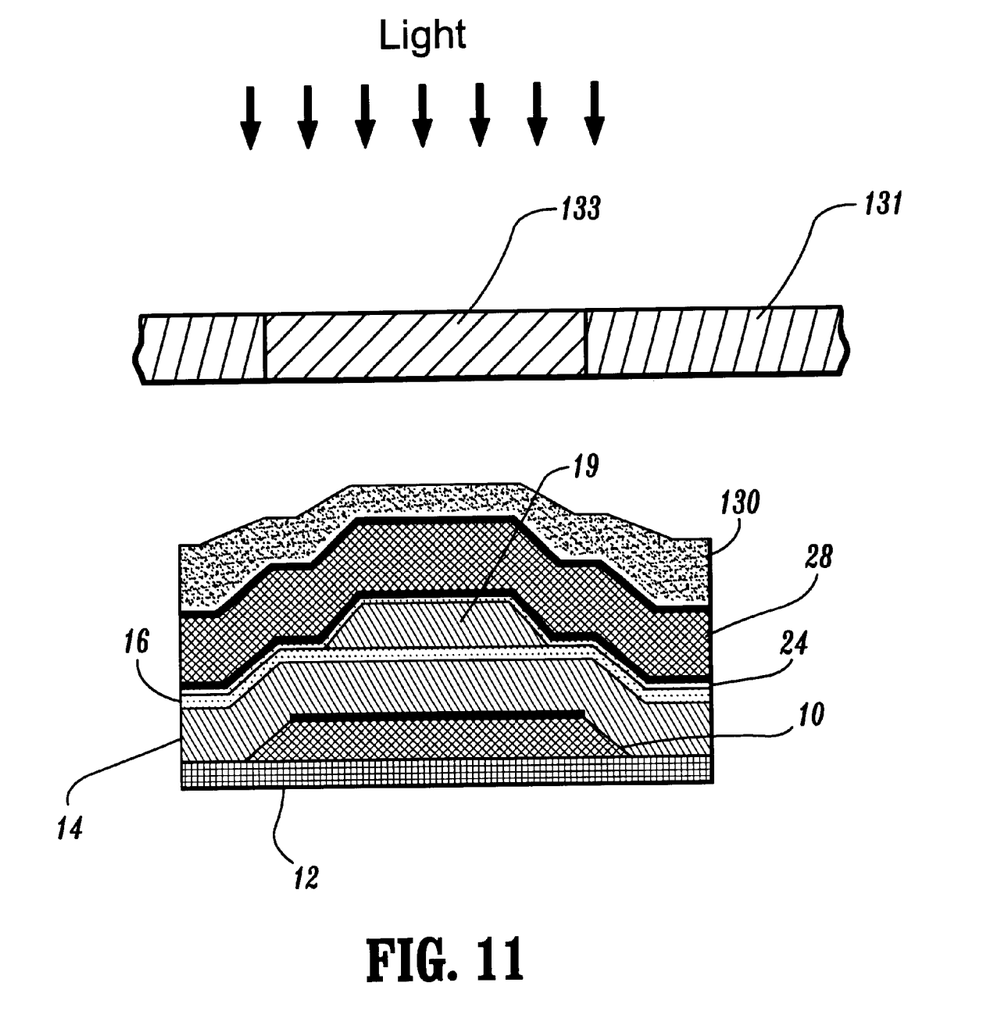
FIG. 11 is a cross-sectional view of a thin film transistor of FIG. 6A showing the second photoresist exposed using a gray scale mask in accordance with the present invention.

Referring to FIG. 11, a photoresist 130 is patterned by UV exposure through top mask 131 followed by development to leave resist images or patterns of a source and drain 32 (with a gap therebetween), signal lines 34 (or data lines), capacitor electrode patterns 36 and all other devices which may be part of an active matrix display as shown in FIG. 6B.

In accordance with the present invention, mask 131 includes a gray scale or gray level mask portion 133 which overlaps the Istop layer 19.

Advantageously, fine alignment is not needed between mask portion 133 and Istop layer 19 due to the reduced photoresist thickness on Istop layer 19. In one example, the gray level mask portion 133 extends beyond the Istop region 19 by about 2 microns on each side.

Figure 12:
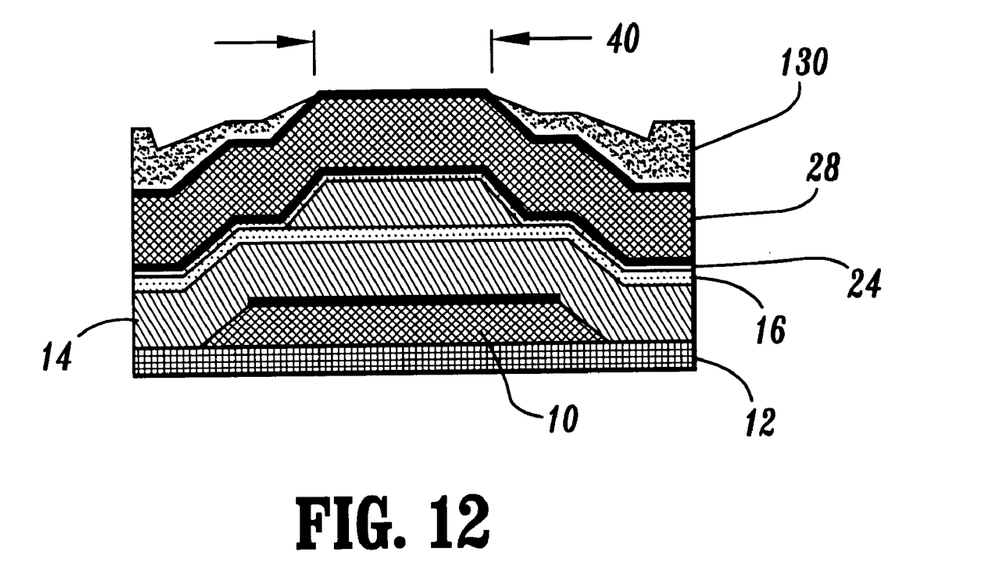
FIG. 12 is a cross-sectional view of the thin film transistor of FIG. 11 showing a second photoresist thinned to expose the conductor over the self-aligned top insulator after resist development by employing a gray scale mask in accordance with the present invention.

Gray scale portions 133 are employed to reduce light exposure of resist 130 at selected locations, e.g., over Istop layer 19. In this way, resist 130 is exposed enough to remove its entire thickness from conductive layer 28 over Istop layer 19 during the development of resist 130, as shown in FIG. 12. In this way, the patterned resist images are exposed such that the resist on layer 28 overlying portion 19 is completely removed before the resist elsewhere has been removed after developing.

Figure 13:
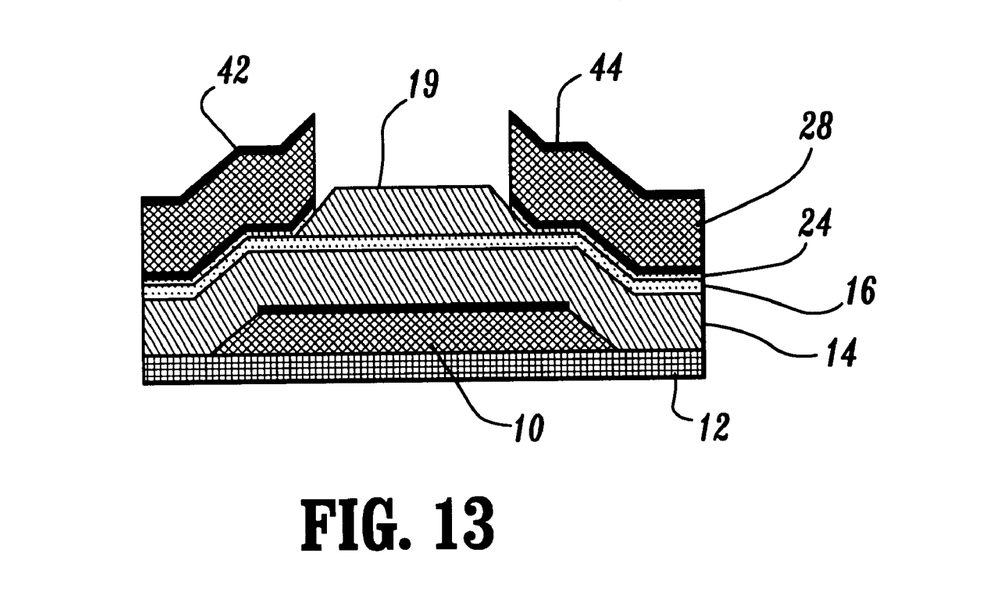
FIG. 13 is a cross-sectional view of the thin film transistor of FIG. 12 showing the second photoresist removed after being employed to etch the conductor and the doped semiconductor layers in accordance with the present invention.

Referring to FIG. 13, conductor layer 28 and doped semiconductor layer 24 are etched in accordance with the resist pattern such that a drain electrode 42 and a source electrode 44 are formed and are aligned to gate electrode 10 (since portion 19 is also self-aligned to electrode 10) thereby forming a fully-self-aligned TFT. Signal lines (data lines) 50, capacitor electrodes 52 and all other devices may be simultaneously formed (See, e.g., FIG. 10B). In preferred embodiments, the etching of layer 28 is performed by a wet etching process. In one embodiment, the etching uses a mixture of phosphoric, acetic and nitric acids known as a PAN etch for aluminum, Al alloys and molybdenum metals. The etching of layers 24 and 16 is preferably performed by dry etching. Resist 130 is then removed. Note that, it is acceptable to even remove some resist from conductive layer 28 over the tapered sides of channel insulator 19. Conductive layer 28 and semiconductor layer 24 cannot form an electrical connection over channel insulator 19, and semiconductor layer 24 extends some small distance up the tapered edges of channel insulator 19 (as shown in FIG. 13). Processing now continues as is known in the art.

In accordance with the present invention, use of gray level exposure with different density gray level mask regions with or without plasma etching or ashing can be used in different regions of the display and for different devices to compensate for the differences in the thickness of the resist remaining on the conductor over the channel insulator. The density of the gray level mask regions may be adjusted so that after the lithographic processing a thin and nearly constant thickness of photoresist is remaining over the channel insulator (Istop) and is then removed by plasma etching. By leaving a thin layer of resist over the channel insulator after lithographic processing, the variations in lithographic processing will only change the thickness of this layer and not result in devices which fail to perform as desired.

Lithographic processing is complex and depends on many interrelated process steps and is generally optimized for throughput and linewidth control whereas plasma etching is a single fairly repeatable step which may be easier to employ to achieve the necessary process control. With this approach, if necessary, the thickness of the remaining photoresist on the channel insulator can be measured and the etching process adjusted to only remove the correct amount of resist.

Figure 14:
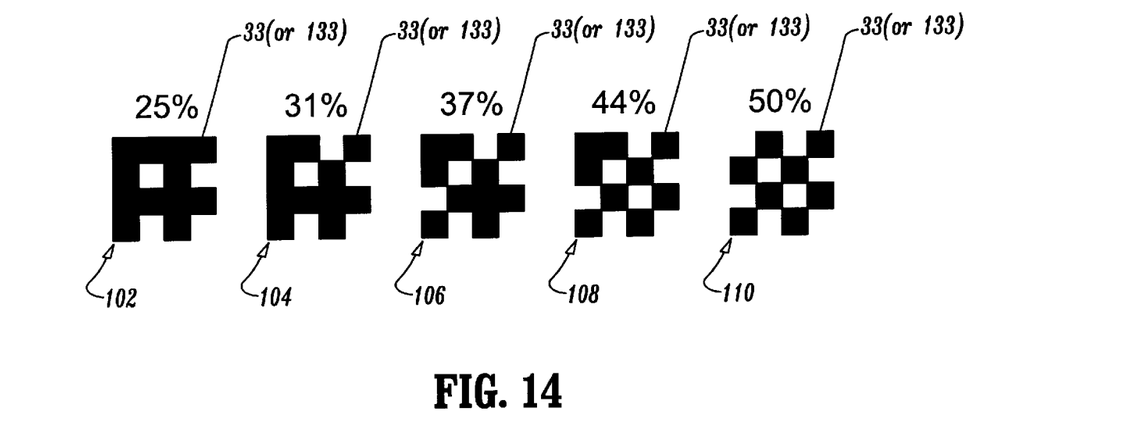
FIG. 14 depicts illustrative gray level patterns and features, the features are not individually resolvable by the exposure tool employed in accordance with the present invention.

Referring to FIG. 14, an illustrative example of gray scale patterns 102–110 are shown. The size of the features of the gray level mask are such that they are not resolved individually by the exposure tool used. In this illustrative example, a box pattern is shown to limit light transmitted through gray scale portions 33 (or 133). A percent value is shown to indicate the amount of light transmitted through each pattern 102–110. It is to be understood that although square or boxes are shown other geometries or patterns may be employed. For example, dots, slits, rectangles, etc. may be employed for each pattern. Patterns 102–110, limit the amount of transmitted light to increase the amount of resist remaining after development in designated areas. Different gray scale densities are employed to result in different resist thicknesses remaining after development.

Further different gray scale densities may be employed depending on the thickness of the resist to be removed. For example, the resist may be thicker in regions where a longer channel length is needed or a higher pattern density exists (e.g., higher component or transistor density).

In accordance with the invention, a region of the gate conductor (gate lines) which forms gate electrode 10 (FIG. 1A) of the pixel TFT is chosen according to the final design length of the TFT. In a conventional non-fully-self-aligned process, the minimum width is in the neighborhood of about 11 μm to allow for sufficient overlap of the D/S electrodes over the Istop feature. The minimum width of the Istop feature depends on the development and etch bias of the back-expose process. In the non-self-aligned process of the prior art, it also,depends on the minimally acceptable gap size of the photoexposure process, which is in the neighborhood of between about 2 μm and about 3 μm.

Considering overlay accuracy, a typical design for the conventional non-self-aligned TFT is: gate width=11 μm, Istop width=8 μm, a gap between S/D on top of Istop=4 μm. This means the S/D contact area (the area between the edge of the underlying gate and the base edge of the Istop) is about 1.5 μm on both sides.

If it were chosen to have the same contact area, but use the self-aligned process as described for the present invention, the minimum gap size between S/D contacts is no longer a concern. Dropping this constraint alone permits a gate width of about 7 μm and an Istop width of about 4 μm. Since the overlay of the gap on the Istop is not a concern the TFT can be reduced in size. For example, the TFTs may be as short as about 2 μms! In accordance with the invention, the thin film transistor may include a length between about 2 microns to about 10 microns. Using a gray scale mask alone (e.g., without the plasma etching step), devices with a channel length of about 5.5 microns have been fabricated, where conventional channel lengths were 8 microns.

Having described preferred embodiments of a method of forming fully self-aligned TFT with improved process window (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for opening resist in raised areas of a trilayer thin film transistor device, comprising the steps of:

forming a conductive layer over a channel insulator layer to form a raised portion which includes a height above a substantially planar surrounding area, the channel insulator layer comprising tapered edges and being aligned to a gate electrode;

forming a photoresist layer on the conductive layer over the raised portion and the surrounding area;

patterning the photoresist by employing a gray scale light mask to reduce exposure light on the photoresist over the raised portion such that after developing the photoresist a thickness of the photoresist is less over the raised portion than the thickness of the photoresist in the surrounding area;

uniformly etching the photoresist to form a gap in the photoresist down to the conductive layer only over the channel insulator; and etching the conductive layer in accordance with the photoresist to form source and drain electrodes, wherein said source and drain electrodes are adjustably self aligned to the channel insulator layer using the tapered edges of the channel insulator layer.

2. The method as recited in claim 1, wherein the step of uniformly etching the photoresist includes the step of plasma ashing the photoresist to form the gap in the photoresist at the raised portion.

3. The method as recited in claim 2, wherein the step of plasma ashing the photoresist includes employing oxygen plasma.

4. The method as recited in claim 1, wherein the step of etching the conductive layer in accordance with the photoresist includes the step of wet etching the conductive layer to form the source and drain electrodes.

5. The method as recited in claim 1, wherein the conductive layer includes at least one of Indium Tin Oxide, Indium Zinc Oxide, aluminum, molybdenum, chromium, tungsten and copper.

6. The method as recited in claim 1, wherein the step of patterning the photoresist layer includes the step of patterning the photoresist layer to form patterns for at least one of data lines and capacitor electrodes.

7. The method as recited in claim 1, wherein the step of patterning the photoresist by employing a gray scale light mask includes the step of patterning the photoresist by employing a gray scale light mask wherein the gray scale mask includes a gray scale window for exposing the photoresist which is wider than the raised portion.

8. The method as recited in claim 1, wherein the thin film transistor includes a semiconductor layer below the channel insulator layer and the step of forming a conductive layer includes forming ohmic contacts between the source and drain electrodes and the semiconductor layer.

9. The method as recited in claim 1, wherein the channel insulator is self-aligned to the gate electrode.

10. A method for forming a thin film transistor having source and drain electrodes self-aligned to a top insulator, comprising the steps of:

forming a thin film transistor structure including an opaque gate electrode on a substrate, a first dielectric layer formed over the gate electrode, a semiconductor layer formed on the first dielectric layer, and a second dielectric layer formed on the semiconductor layer;

forming a top insulator comprising tapered edges from the second dielectric layer in alignment with the gate electrode;

depositing a doped semiconductor layer and a conductive layer on the doped semiconductor layer;

forming a photoresist on the conductive layer;

patterning the photoresist to form patterns for components and to form a contiguous transistor electrode pattern covering the top insulator by employing a gray scale light mask to reduce exposure light on the photoresist over the top insulator such that after developing the photoresist a thickness of the photoresist is less over the top insulator than the thickness of other remaining portions of the photoresist;

uniformly etching the photoresist to form a gap over the top insulator in the photoresist for the transistor electrode pattern, the gap formed only over the top insulator; and etching the conductive layer and the doped semiconductor layer selective to the photoresist such that a source electrode and a drain electrode are formed which are adjustably self-aligned relative to the top insulator using the tapered edges of the top insulator.

11. The method as recited in claim 10, wherein the step of uniformly etching the photoresist includes the step of plasma ashing the photoresist to form the gap in the photoresist at the top insulator.

12. The method as recited in claim 11, wherein the step of plasma ashing the photoresist includes employing oxygen plasma.

13. The method as recited in claim 10, wherein the conductive layer includes at least one of Indium Tin Oxide, Indium Zinc Oxide, aluminum, molybdenum, chromium, tungsten and copper.

14. The method as recited in claim 10, wherein the step of etching the conductive layer includes the step of wet etching the conductive layer with a mixture of phosphoric, acetic and nitric acids.

15. The method as recited in claim 10, wherein the step of patterning the photoresist layer includes the step of patterning the photoresist layer to form patterns for at least one of data lines and capacitor electrodes.

16. The method as recited in claim 10, further comprising the step of forming the gate electrode with tapered edges.

17. The method as recited in claim 10, further comprising the step of forming the thin film transistor with a channel length of between about 2 microns to about 10 microns.

18. The method as recited in claim 10, wherein the top insulator is self-aligned to the gate electrode.

19. The method of claim 10, wherein the doped semiconductor layer extends partially up the tapered edges of the top insulator.

20. A method for forming a thin film transistor having source and drain electrodes self-aligned to a top insulator, comprising the steps of:

forming an opaque gate electrode on a substrate;

depositing a first dielectric layer on the gate electrode and the substrate;

depositing a semiconductor layer on the first dielectric layer;

depositing a second dielectric layer on the semiconductor layer;

depositing a first photoresist on the second dielectric layer and patterning the first photoresist by employing the gate electrode as a mask for blocking light used to expose the first photoresist;

etching the second dielectric layer to form a top insulator having tapered edges in self-alignment with the gate electrode;

removing the first photoresist;

depositing a doped semiconductor layer;

depositing a conductive layer on the doped semiconductor layer;

forming a second photoresist on the conductive layer;

patterning the photoresist to form patterns for components and to form a contiguous transistor electrode pattern covering the top insulator by employing a gray scale light mask to reduce exposure light on the second photoresist over the top insulator such that after developing the second photoresist a thickness of the second photoresist is less over the top insulator than the thickness of other remaining portions of the second photoresist;

uniformly etching the photoresist to form a gap over the top insulator in the second photoresist for the transistor electrode pattern at the top insulator, the gap in the photoresist layer being formed only over the top insulator; and etching the conductive layer and the doped semiconductor layer selective to the second photoresist such that a source electrode and a drain electrode are formed which are adjustably self-aligned relative to the top insulator using the tapered edges of a the top insulator.

21. The method as recited in claim 20, wherein the step of uniformly etching the second photoresist includes the step of plasma ashing the second photoresist to form the gap in the second photoresist at the top insulator.

22. The method as recited in claim 21, wherein the step of plasma ashing the second photoresist includes employing oxygen plasma.

23. The method as recited in claim 20, wherein the conductive layer includes at least one of Indium Tin Oxide, Indium Zinc Oxide, aluminum, molybdenum, chromium, tungsten and copper.

24. The method as recited in claim 20, wherein the step of etching the conductive layer includes the step of wet etching the conductive layer with a mixture of phosphoric, acetic and nitric acids.

25. The method as recited in claim 20, wherein the step of patterning the second photoresist layer to form patterns for components includes the step of patterning the second photoresist layer to form patterns for at least one of data lines and capacitor electrodes.

26. The method as recited in claim 20, further comprising the step of forming the gate electrode with tapered edges.

27. The method as recited in claim 20, further comprising the step of forming the thin film transistor with a channel length of between about 2 microns to about 10 microns.

28. The method as recited in claim 20, wherein the step of patterning the first photoresist by employing the gate electrode as a mask for blocking light used to expose the first photoresist includes employing the gate electrode as a mask in a back-side exposure step and employing a photomask in a front-side exposure step to further expose the first photoresist.

29. The method of claim 20, wherein the doped semiconductor layer extends partially up the tapered edges of the top insulator.

* * * * *